United States Patent
Ueda et al.

(10) Patent No.: US 10,951,796 B2
(45) Date of Patent: Mar. 16, 2021

(54) IMAGE PICKUP APPARATUS INCLUDING THERMALLY ISOLATED RADIO ANTENNA AND THERMALLY ISOLATED ELECTRONIC VIEWFINDER

(71) Applicant: CANON KABUSHIKI KAISHA, Tokyo (JP)

(72) Inventors: Haruhisa Ueda, Tokyo (JP); Natsumi Sekiguchi, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 6 days.

(21) Appl. No.: 16/388,941

(22) Filed: Apr. 19, 2019

(65) Prior Publication Data

US 2019/0335075 A1 Oct. 31, 2019

(30) Foreign Application Priority Data

Apr. 25, 2018 (JP) .............................. JP2018-084280

(51) Int. Cl.
*H04N 5/225* (2006.01)
*H01Q 1/22* (2006.01)
(Continued)

(52) U.S. Cl.
CPC ........... *H04N 5/22525* (2018.08); *H01Q 1/22* (2013.01); *H01Q 1/2291* (2013.01); *H01Q 1/243* (2013.01);
(Continued)

(58) Field of Classification Search
CPC .. H04N 5/225; H04N 5/22525; H04N 5/2251; H04N 5/2252; H04N 5/22521;
(Continued)

(56) References Cited

U.S. PATENT DOCUMENTS 9,986,137 B2   5/2018  Iwasa
10,141,625 B1*  11/2018  Ryu .......................... H01Q 1/02
(Continued)

FOREIGN PATENT DOCUMENTS

| CN | 104144286 A | 11/2014 |
| CN | 107024818 A | 8/2017 |
| JP | 2017111218 A | 6/2017 |

OTHER PUBLICATIONS

Office Action issued in Chinese Application No. 201910335206.2 dated Nov. 17, 2020. English translation provided.

*Primary Examiner* — Twyler L Haskins
*Assistant Examiner* — Akshay Trehan
(74) *Attorney, Agent, or Firm* — Rossi, Kimms & McDowell LLP

(57) ABSTRACT

An image pickup apparatus equipped with an electronic viewfinder, which has a radio antenna arranged therein in a space saving manner while preventing a casing from becoming hot and suppressing electric noise. An electronic viewfinder (EVF) has a display section that displays an image of an object, captured by an image sensor. A wireless communication module has an antenna capable of performing wireless communication and is arranged in a manner overlapping the electronic viewfinder. A metal member is disposed between the wireless communication module and the EVF, and has the wireless communication module fixed thereto. The wireless communication module is thermally connected to a main body structure. The electronic viewfinder is thermally connected to a top cover different from the main body structure.

6 Claims, 12 Drawing Sheets

(51) Int. Cl.
*H01Q 1/24* (2006.01)
*H01Q 1/36* (2006.01)
*H01Q 1/38* (2006.01)
*H01Q 1/42* (2006.01)
*H01Q 1/44* (2006.01)
*H01Q 9/30* (2006.01)
*H05K 1/02* (2006.01)
*H05K 7/20* (2006.01)
*H04N 21/478* (2011.01)
*H04N 21/462* (2011.01)

(52) U.S. Cl.
CPC ............... *H01Q 1/36* (2013.01); *H01Q 1/38* (2013.01); *H01Q 1/42* (2013.01); *H01Q 1/44* (2013.01); *H01Q 9/30* (2013.01); *H04N 5/2252* (2013.01); *H04N 5/2253* (2013.01); *H04N 5/22521* (2018.08); *H05K 1/0203* (2013.01); *H05K 7/2039* (2013.01); *H05K 7/20963* (2013.01); *H04N 21/4622* (2013.01); *H04N 21/478* (2013.01)

(58) Field of Classification Search
CPC ....... H04N 2005/44578; H04N 5/2253; H04N 2201/006; H04N 5/23293; H04N 5/232933; H04N 5/232935; H04N 5/232939; H04N 5/232941; H04N 5/232945; G02B 23/14–145; G03B 17/02; G03B 17/20; G03B 13/00–16; G03B 2213/00–025; G06F 3/1683; G06F 2213/3814; G06F 1/1698; H04B 5/00–06; H04W 4/008; H01Q 1/00; H01Q 1/22; H01Q 1/2275; H01Q 1/2283; H01Q 1/2291; H01Q 1/24; H01Q 1/242; H01Q 1/243; H01Q 1/36; H01Q 1/38; H01Q 1/42; H01Q 1/44; H01Q 1/244; H01Q 9/00; H01Q 9/30; H05K 7/20954; H05K 7/20963; H05K 7/20972; H05K 5/0017; H05K 1/0201; H05K 1/0203; H05K 1/0204; H05K 1/0206; H05K 1/0207; H05K 1/0209; H05K 1/021; H05K 7/20; H05K 7/2039; H05K 7/205; H05K 7/20509; H05K 5/0273; H05K 5/04
USPC ............... 348/333.01–333.13, 373–376; 396/56–59, 141, 148–152, 373–386
See application file for complete search history.

(56) References Cited

U.S. PATENT DOCUMENTS

| | | | |
|---|---|---|---|
| 2006/0170597 A1* | 8/2006 | Kurashima | H01Q 1/44 343/700 MS |
| 2010/0158508 A1* | 6/2010 | Kim | H04N 5/2254 396/529 |
| 2013/0107115 A1* | 5/2013 | Tobinaga | H04N 5/2253 348/374 |
| 2013/0223836 A1* | 8/2013 | Gibbs | H01Q 9/42 396/535 |
| 2014/0078694 A1* | 3/2014 | Wissmar | A61B 5/681 361/749 |
| 2014/0328084 A1* | 11/2014 | Chuang | H01Q 7/00 362/623 |
| 2015/0049243 A1* | 2/2015 | Samuels | H04N 5/2253 348/374 |
| 2015/0195442 A1* | 7/2015 | Pacurariu | H04N 5/23203 348/211.2 |
| 2015/0349406 A1* | 12/2015 | Jung | H01Q 7/00 343/702 |
| 2016/0119516 A1* | 4/2016 | Clearman | F16M 11/041 348/373 |
| 2017/0042058 A1* | 2/2017 | Pope | H05K 7/205 |
| 2018/0107099 A1* | 4/2018 | Yasuda | H04N 5/22521 |
| 2019/0081394 A1* | 3/2019 | Edwards | H01Q 1/48 |
| 2019/0159355 A1* | 5/2019 | Baek | H01Q 1/22 |
| 2020/0144708 A1* | 5/2020 | Kim | H05K 1/0243 |

* cited by examiner

IMAGE PICKUP APPARATUS INCLUDING THERMALLY ISOLATED RADIO ANTENNA AND THERMALLY ISOLATED ELECTRONIC VIEWFINDER

BACKGROUND OF THE INVENTION

Field of the Invention

The present invention relates to an image pickup apparatus, such as a digital camera and a digital video camera, and more particularly to an image pickup apparatus equipped with wireless communication means and an electronic viewfinder.

Description of the Related Art

Image pickup apparatuses, such as a digital video camera, include one equipped with a wireless communication function which makes it possible to communicate with an external apparatus. To stabilize wireless communication sensitivity, it is necessary to arrange an antenna at a location close to the exterior surface of the image pickup apparatus, and also such that the antenna is not hidden e.g. by a user's hand or head when the user uses the image pickup apparatus. For example, in Japanese Laid-Open Patent Publication (Kokai) No. 2017-111218, there has been proposed, for the arrangement of wireless communication means related to an image pickup apparatus provided with an optical viewfinder having a pentaprism, a technique for arranging an antenna on the dach surface of a pentaprism on the top of the camera.

However, in the above-mentioned Japanese Laid-Open Patent Publication (Kokai) No. 2017-111218, in a case where e.g. an electronic viewfinder is provided, if a radio antenna and the electronic viewfinder, both of which are heat generation sources, are disposed close to each other, the temperature of a casing or the like to which these components are thermally connected, is increased. Further, from the viewpoint of reception performance, the radio antenna is liable to receive noise from peripheral electric components, static electricity, and the like, and the casing or the like electrically connected as a ground (GND) is required to be a large conductor. However, if the radio antenna is connected to the casing or the like, which is similar to the electronic viewfinder, there is a problem of heat dissipation as described above, which makes it difficult to easily connect the radio antenna to a large metal casing.

Further, in a case where an exterior is formed of a material having a low conductivity, such as resin, so as to reduce the weight, and the radio antenna is connected to the exterior, the ground connection of the wireless communication means becomes unstable, and hence there is a fear that it is impossible to ensure proper wireless performance.

SUMMARY OF THE INVENTION

The present invention provides an image pickup apparatus equipped with an electronic viewfinder, which has a radio antenna arranged therein in a space saving manner while preventing a casing from becoming hot and suppressing electric noise.

The present invention provides an image pickup apparatus comprising an image pickup unit, an electronic viewfinder having a display section that displays an image of an object, captured by the image pickup unit, a wireless communication unit which has an antenna capable of performing wireless communication and is arranged in a manner overlapping the electronic viewfinder, a metal member which is disposed between the wireless communication unit and the electronic viewfinder and to which the wireless communication unit is fixed, a first casing to which the wireless communication unit is thermally connected, and a second casing which is different from the first casing and to which the electronic viewfinder is thermally connected.

According to the present invention, in the image pickup apparatus equipped with the electronic viewfinder, the radio antenna is arranged in a space saving manner while preventing a casing from becoming hot and suppressing electric noise radio antenna.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof.

Figure 1A:
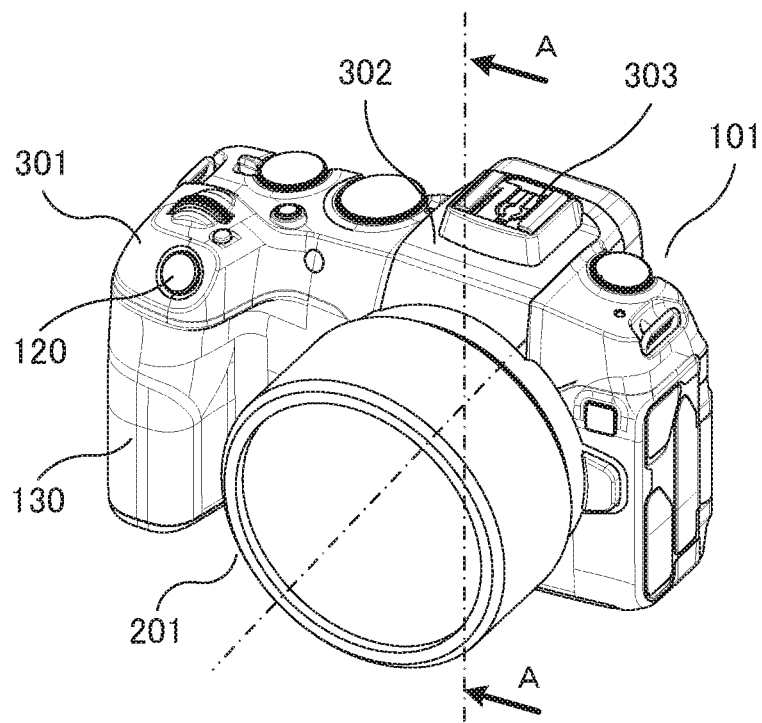
FIG. 1A is a front perspective view of a digital camera as an image pickup apparatus according to a first embodiment of the present invention.
Figure 1B:
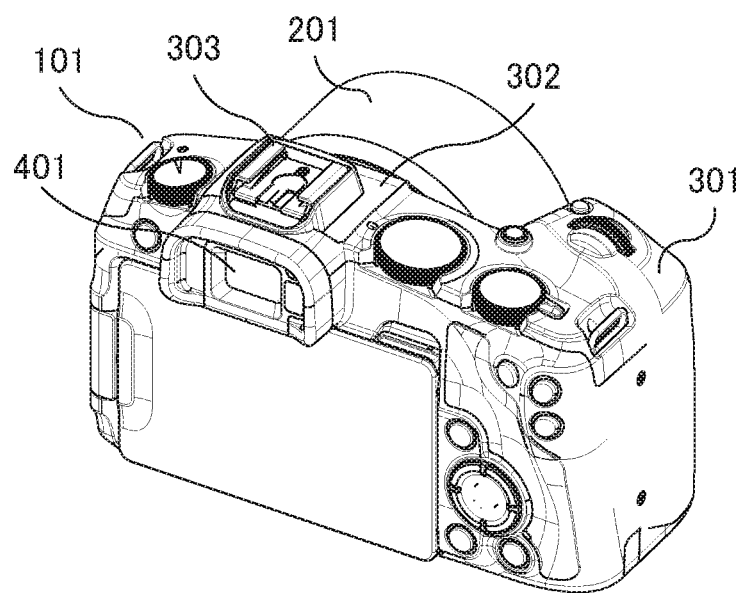
FIG. 1B is a rear perspective view of the digital camera shown in FIG. 1A.

FIG. 1A is a front perspective view of a digital camera as an image pickup apparatus according to a first embodiment of the present invention. FIG. 1B is a rear perspective view of the digital camera shown in FIG. 1A.

As shown in FIGS. 1A and 1B, the digital camera according to the present embodiment has a lens barrel 201 mounted on a front side of a camera boy 101. In a state of the digital camera in which the lens barrel 201 is mounted, the camera body 101 and the lens barrel 201 are electrically connected to each other via a mount contact group (not shown). An upper surface of the camera body 101 is covered by a top cover 301. The top cover 301 is formed of a conductive member, such as conductive resin, and suppresses the influence of radiation of unnecessary noise and external noise on the camera body 101. The top cover 301 corresponds to an example of a second casing of the present invention.

An antenna cover 302 covers a wireless communication module 501, described hereinafter. The antenna cover 302 is formed of a non-conductive material, such as polycarbonate. This allows wireless radio waves to transmit therethrough and enables communication between an external apparatus (such as a personal computer) connected to a wireless communication network and the wireless communication module 501. An accessory shoe 303 is a part for attaching an accessory used in photographing, such as a strobe device, to the camera body 101.

A grip 130 is a holding part used by a user for holding the camera body 101 by hand. A photographing button 120 is pressed by the user to cause the digital camera to start a photographing operation. An electronic viewfinder (hereinafter referred to as the EVF) 401 is a display section which is used by the user to view an object image.

Figure 2:
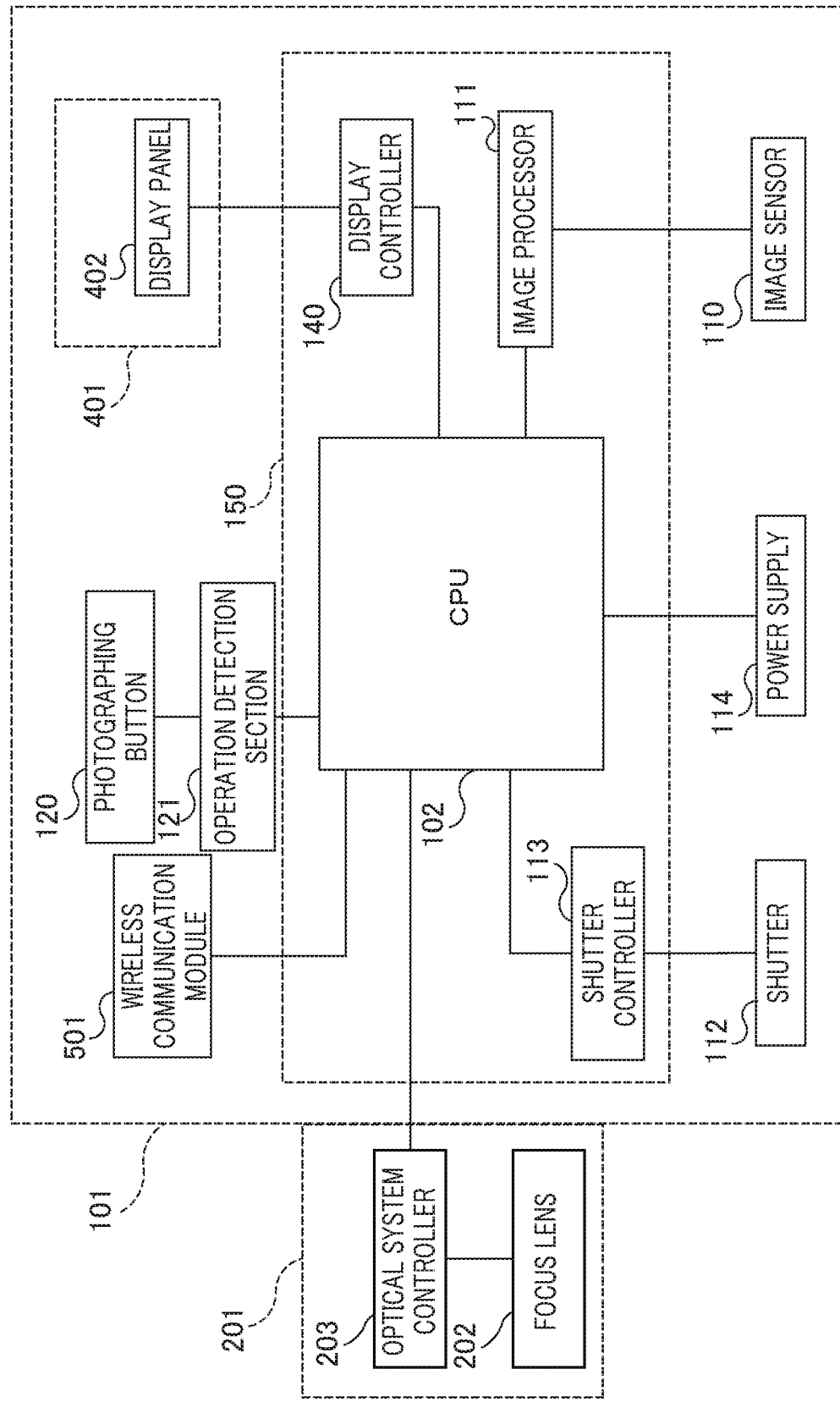
FIG. 2 is a block diagram showing the system configuration of the digital camera shown in FIGS. 1A and 1B.

FIG. 2 is a block diagram showing the system configuration of the digital camera shown in FIGS. 1A and 1B. Referring to FIG. 2, a CPU (central processing unit) 102 controls the overall operation of the camera body 101 and executes various processing operations and instructions for components thereof. A main circuit board 150 has various components mounted thereon for forming the CPU 102 etc. A power supply 114 supplies electric power to circuit components of the camera body 101.

An image sensor 110 is implemented e.g. by a CCD or CMOS sensor, and converts an optical image of an object captured through a photographing optical system of the lens barrel 201 to image signals. The image signals obtained by the image sensor 110 are converted to image data by an image processor 111, and the image data is output to the CPU 102.

The lens barrel 201 is formed by a plurality of lenses (not shown) including a focus lens 202, a diaphragm (not shown), and so forth. An optical system controller 203 drives the focus lens 202 and the diaphragm based on signals input from the CPU 102 via the mount contact group to adjust the focus of the lens barrel 201 and an amount of light entering the camera body 101.

A shutter 112 that adjusts the exposure time of the image sensor 110 is disposed between the lens barrel 201 and the image sensor 110. A shutter controller 113 drives the shutter 112 based on a signal input from the CPU 102. When the photographing button 120 is pressed by the user, an operation detection section 121 detects the pressing operation and outputs a detection signal to the CPU 102, whereby photographing is started.

The EVF 401 includes a display panel 402, such as an organic EL panel, and a display controller 140 causes photographing information and an image acquired from the image sensor 110 to be displayed on the display panel 402. The wireless communication module 501 can perform e.g. transfer of an image to an external apparatus by wireless communication. The wireless communication module 501 corresponds to an example of a wireless communication unit of the present invention.

Figure 3A:
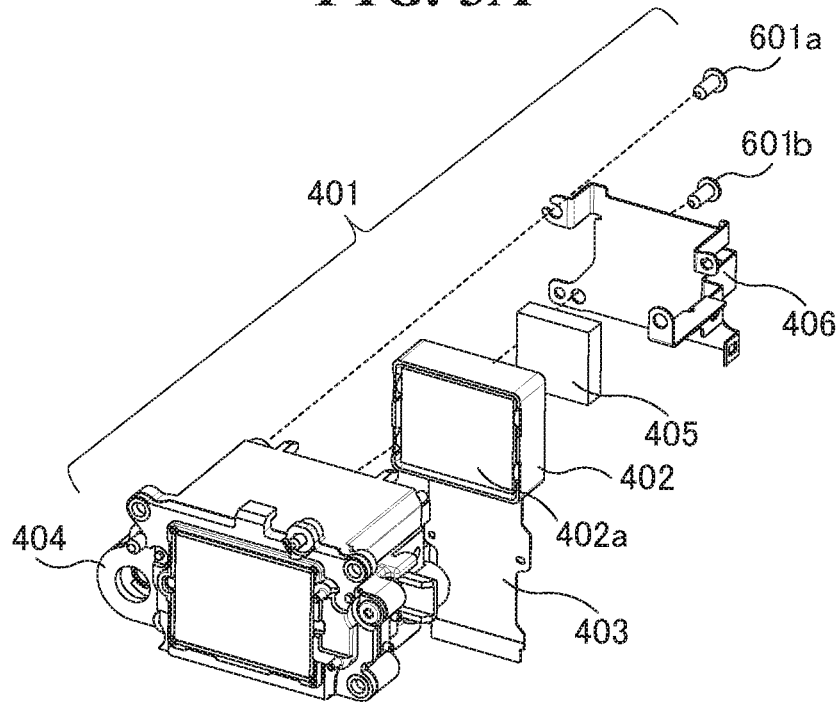
FIG. 3A is an exploded rear perspective view of an electronic viewfinder.

Next, a method for diffusing heat generated in the EVF 401 into the camera body 101 will be described with reference to FIGS. 3A, 3B, and 4. FIG. 3A is an exploded rear perspective view of the EVF 401, and FIG. 3B is an exploded front perspective view of the EVF 401.

Figure 3B:
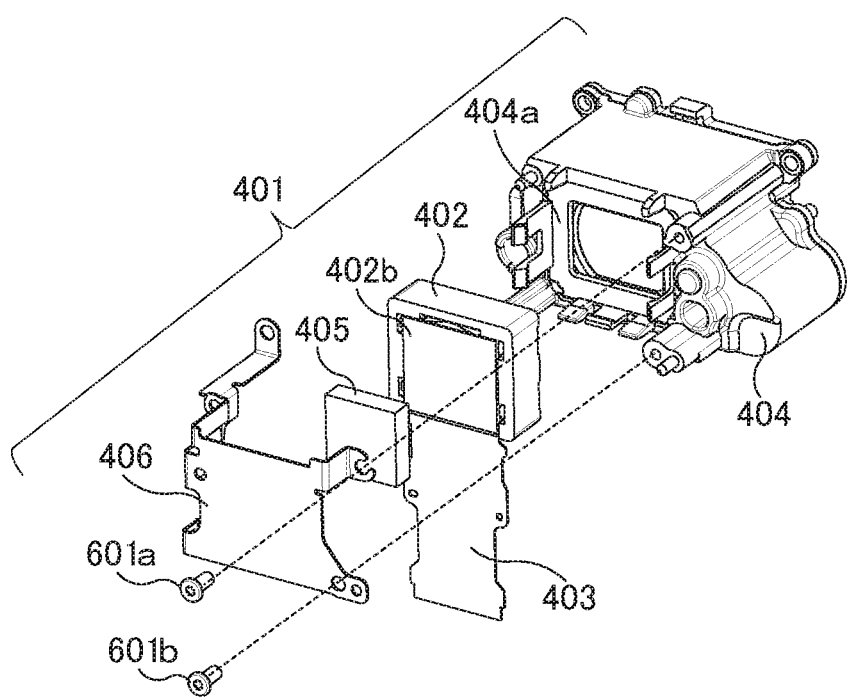
FIG. 3B is an exploded front perspective view of the electronic viewfinder.

As shown in FIGS. 3A and 3B, a connection member 403, such as an FPC, is connected to the display panel 402, and the connection member 403 is connected to a connector (not shown) mounted on the main circuit board 150. An optical lens, not shown, is accommodated in an EVF holder 404, and the user can view an image displayed on an image display section 402a on the front of the display panel 402 through the optical lens. The EVF holder 404 is provided with an accommodating section 404a for accommodating and holding the display panel 402.

The display panel 402 is high in the temperature of its own generated heat, and if the display panel 402 is continuously used for a long time period, the temperature of the display panel 402 may exceed the guaranteed operating temperature, and hence it is necessary to provide a heat dissipation structure. To this end, a first heat dissipation member 406 formed e.g. by a metal plate having high thermal conductivity is connected to a rear surface 402b of the display panel 402 via an elastic member 405.

The elastic body 405 is sandwiched between the rear surface 402b of the display panel 402 and the first heat dissipation member 406, whereby an air layer, which is low in thermal conductivity, between the display panel 402 and the first dissipation member 406 is eliminated. This facilitates diffusion of heat generated in the display panel 402 to the first heat dissipation member 406, and hence it is preferable that the elastic member 405 is made of a material having high thermal conductivity. The first heat dissipation member 406 is fastened to the EVF holder 404 with screws 601a and 601b.

Figure 4:
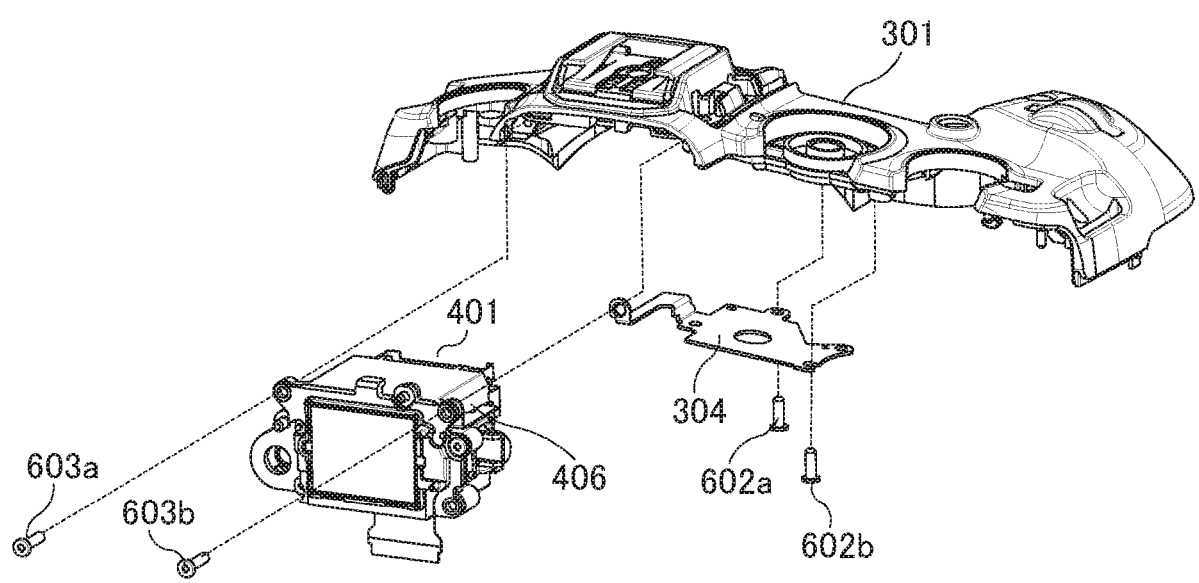
FIG. 4 is an exploded perspective view useful in explaining connection between a top cover and the electronic viewfinder.

FIG. 4 is an exploded perspective view useful in explaining connection between the top cover 301 and the EVF 401. Referring to FIG. 4, a second heat dissipation member 304 is formed of e.g. a metal plate having high thermal conductivity, and is fastened to the top cover 301 with screws 602a and 602b. The EVF 401 is fastened to the top cover 301 with screws 603a and 603b.

At this time, the second heat dissipation member 304 is disposed at a location adjacent to the EVF 401 below the top cover 301, and is brought into contact with the first heat dissipation member 406. This makes it possible to diffuse heat generated in the display panel 402 to the top cover 301 via the elastic member 405, the first heat dissipation member 406, and the second heat dissipation member 304.

Figure 5:
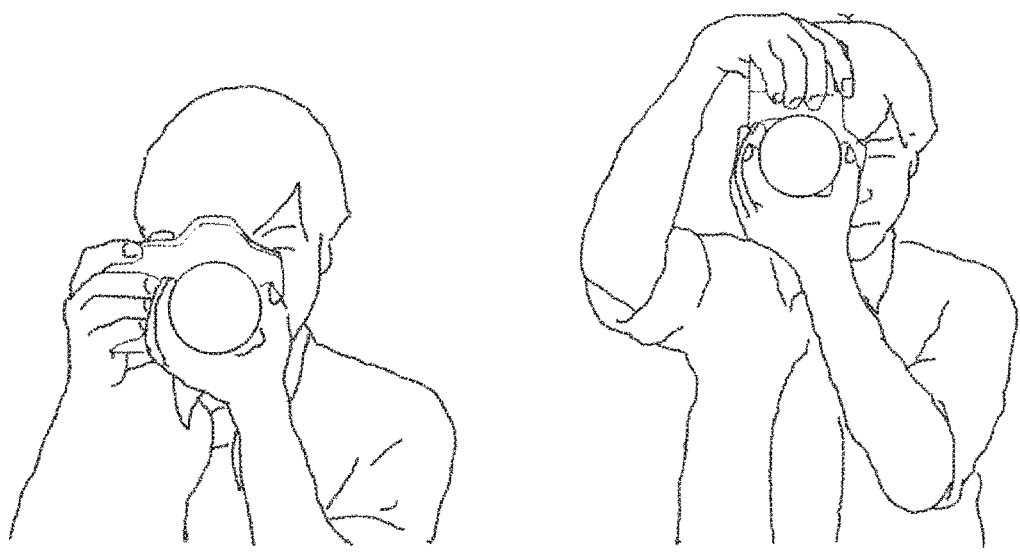
FIG. 5 is a view showing states of the camera used by a user.

When using the camera body 101, the user holds the digital camera in positions as shown in FIG. 5. Therefore, by diffusing heat to the top cover 301 which is not held by the user, it is possible to make heat generated in the display panel 402 easy to dissipate, thereby enhancing the heat dissipation efficiency.

Figure 6A:
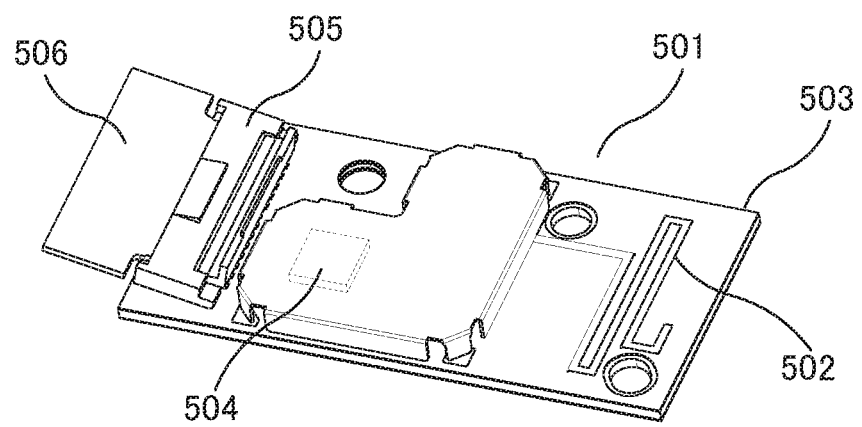
FIG. 6A is a front perspective view of a wireless communication module.
Figure 6B:
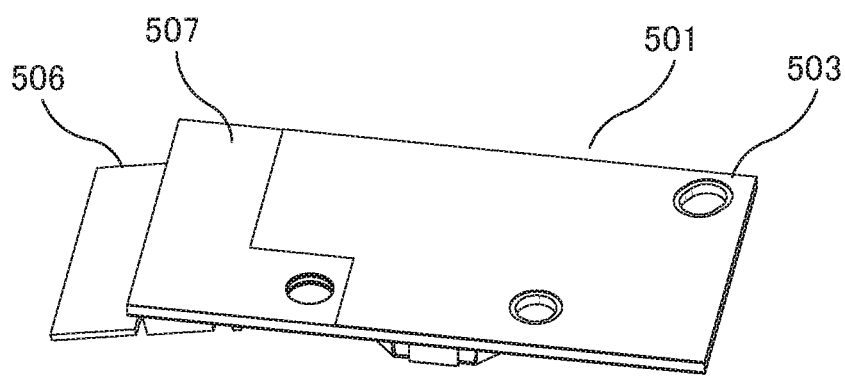
FIG. 6B is a rear perspective view of the wireless communication module.

Next, a method for diffusing heat transferred from the wireless communication module 501 into the camera body 101 will be described with reference to FIGS. 6A, 6B, and 7. FIG. 6A is a front perspective view of the wireless communication module 501 and FIG. 6B is a rear perspective view of the wireless communication module 501. Note that the wireless communication module 501 may be implemented by any of a Wi-Fi module, BLUETOOTH (registered trademark), GPS (GLOBAL POSITIONING SYSTEM), and so forth.

An antenna 502 appearing in FIG. 6A is a microstrip antenna formed by a copper foil pattern on a surface of a wireless communication circuit board 503. A wireless IC 504 is mounted on the wireless communication circuit board 503. Upon receiving a modulated signal from an external apparatus via the antenna 502, the wireless IC 504 converts the received signal to a demodulated signal, and when transmitting data from the wireless IC 504 to an external apparatus, the wireless IC 504 converts the data to a modulated signal and transmits the modulated signal. A connector 505 is mounted on the wireless communication circuit board 503 to connect the wireless communication module 501 to the main circuit board 150 via a connection member 506, such as an FPC. A GND grounding portion (grounding portion formed of a metal material) 507 has a conductive pattern exposed by removing a resist film formed on a surface of the wireless communication circuit board 503, and has been subjected to gold plating and rust-proof treatment.

Figure 7:
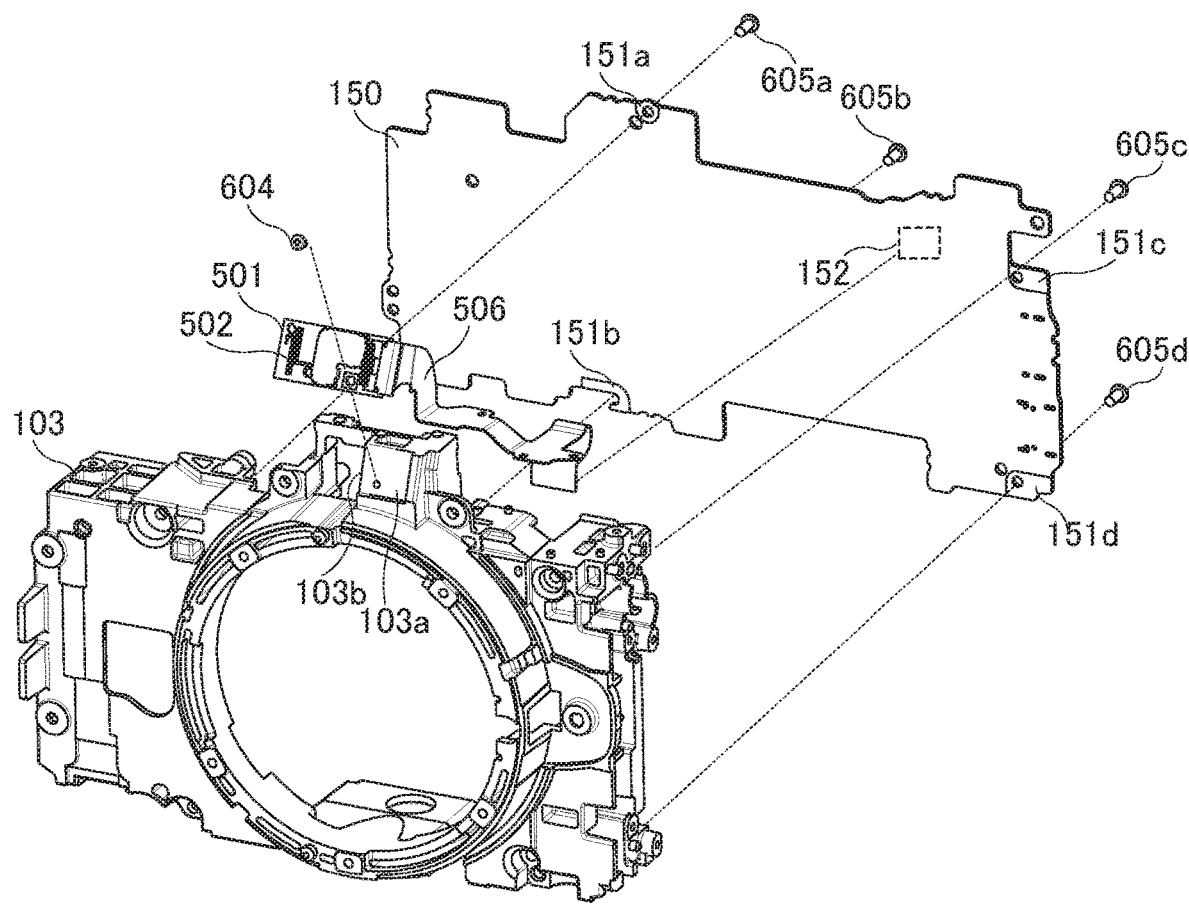
FIG. 7 is an exploded perspective view of components surrounding the wireless communication module.

FIG. 7 is an exploded perspective view of components surrounding the wireless communication module 501. A main body structure 103 appearing in FIG. 7 is formed of metal, such as a magnesium alloy, and forms a skeleton of the camera body 101. The main body structure 103 corresponds to an example of a first casing of the present invention.

The wireless communication module 501 is fastened to the main body structure 103 with a screw 604, and the GND grounding portion 507 of the wireless communication module 501 is brought into contact with a contact portion 103a of the main body structure 103. The wireless communication module 501 is high in the temperature of its own generated heat, and if the wireless communication module 501 is continuously used for a long time period, the temperature of the wireless communication module 501 may exceed the guaranteed operating temperature thereof. To prevent this, the wireless communication module 501 is fastened to the main body structure 103 made of metal having high thermal conductivity, whereby it is possible to diffuse heat generated in the wireless communication module 501 into the whole camera body 101.

The wireless communication module 501 is larger in power consumption than the EVF 401 and hence the wireless communication module 501 generates a larger amount of heat. For this reason, the wireless communication module 501 is connected to the main body structure 103 which has a larger surface area than that of the second heat dissipation member 304 to which the EVF 401 is connected, whereby it is possible to preferentially dissipate heat from the wireless communication module 501 and prevent the temperature of the wireless communication module 501 from exceeding the guaranteed operating temperature.

Further, strong electric and magnetic fields are liable to be generated in the wireless communication module 501, and hence the wireless communication module 501 is easily influenced by electric noise caused by surrounding conductive members and other circuits. To prevent this, the main body structure 103 made of metal having high conductivity is brought into contact with the GND grounding portion 507, whereby it is possible to achieve secure ground connection of the wireless communication module 501 and thereby ensure the wireless performance.

On the other hand, the EVF 401 is less liable to be influence by surrounding conductive members and other circuit boards than the wireless communication module 501. Therefore, by connecting the wireless communication module 501 to the main body structure 103 which has a larger volume than that of the second heat dissipation member 304 to which the EVF 401 is connected, it is possible to preferentially achieve secure ground connection of the wireless communication module 501.

The wireless communication module 501 is connected to a connector 152 mounted on the main circuit board 150 via the connection member 506. GND grounding portions (grounding portions formed of metal material) 151a to 151d of the main circuit board 150 have conductive patterns exposed by removing a resist film formed on a surface of the main circuit board 150 and have been subjected to gold plating and rust-proof treatment.

The main circuit board 150 is fastened to the main body structure 103 with screws 605a to 605d, and the GND grounding portions 151a to 151d of the main circuit board 150 are brought into contact with the main body structure 103. With this, the GND grounding portion 507 of the wireless communication module 501 and the GND grounding portions 151a to 151d of the main circuit board 150 are both connected to the main body structure 103, and hence it is possible to make the potential of the wireless communication module 501 equal to the potential of the main circuit board 150. As a result, it is possible to attain secure ground connection of the wireless communication module 501 and the CPU 102 and thereby ensure the wireless performance.

At this time, the antenna 502 of the wireless communication module 501 is arranged such that it does not overlap an end 103b of the contact portion of the main body structure 103. By disposing the antenna 502 away from the main body structure 103 which is a conductive member, it is possible to prevent marked reduction of the wireless performance.

The wireless communication module 501 is fastened to the main body structure 103 as described above, whereby it is possible to realize a countermeasure against heat generated by the wireless communication module 501 and ensure the wireless performance. Further, it is possible to realize fixing of the wireless communication module 501, the countermeasure against heat, and secure ground connection, using only the main body structure 103, and hence it is possible to reduce the number of components.

Figure 8:
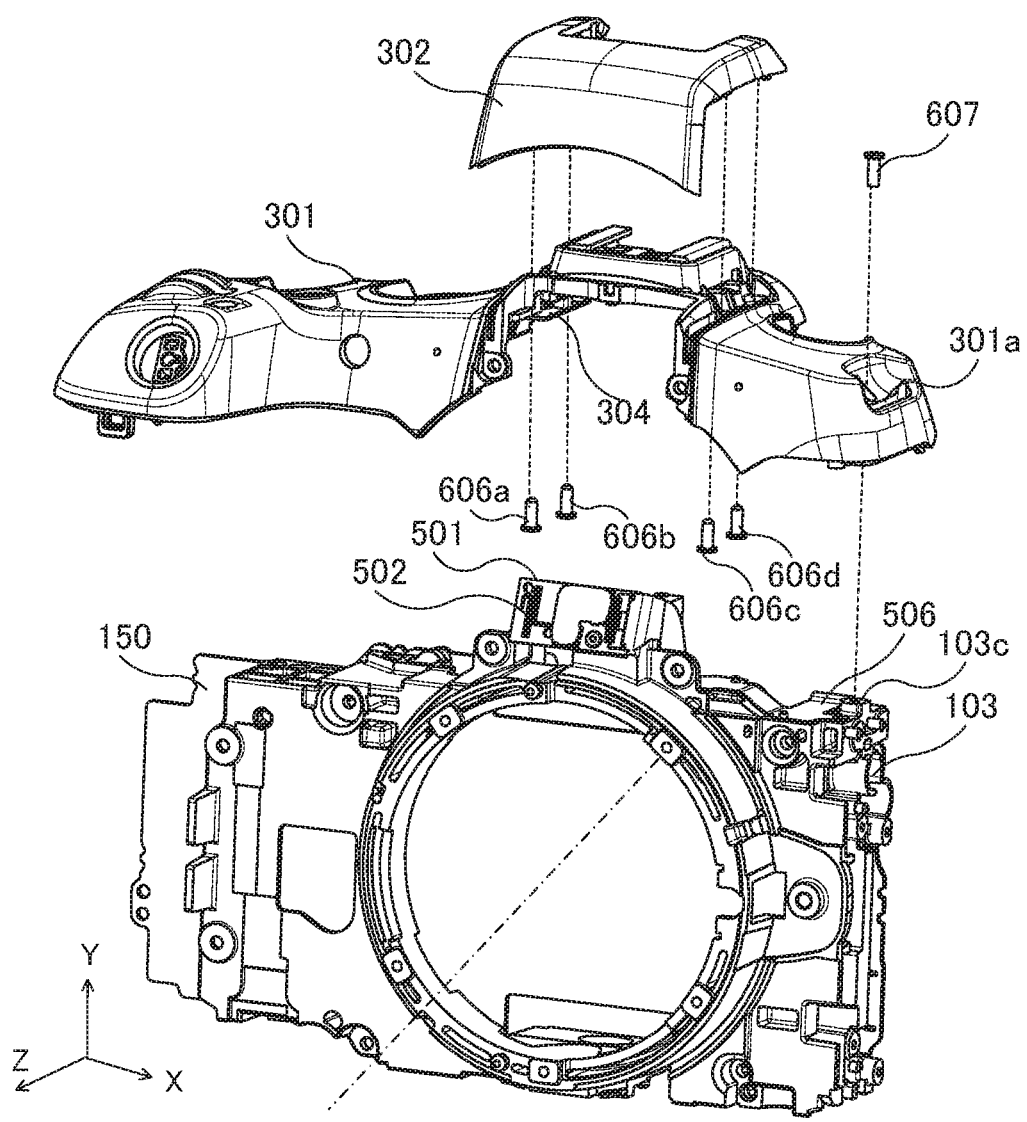
FIG. 8 is an exploded perspective view useful in explaining connection between a main body structure and the top cover.

FIG. 8 is an exploded perspective view useful in explaining connection between the main body structure 103 and the top cover 301. As shown in FIG. 8, the antenna cover 302 is fastened to the top cover 301 with screws 606a to 606d. The top cover 301 has a fastened portion 301a fastened to a fastened portion 103c of the main body structure 103 with a screw 607. Since the top cover 301 is a conductive member, by arranging the top cover 103 such that a projected shadow of the top cover 103 does not overlap the antenna 502 of the wireless communication module 501 as viewed from above and the front (side toward the lens barrel 201), it is possible to ensure the wireless performance.

In FIG. 8, assuming that a direction of an optical axis is represented by a Z-axis, a vertical direction is represented by a Y-axis, and a direction orthogonal to the Y-axis and the Z-axis is represented by an X-axis, the main body structure 103 serving as a heat dissipation path from the wireless communication module 501 is fastened to the fastened portion 301a of the top cover 301 on a positive side of the optical axis in the X-axis direction. On the other hand, as for the EVF 401, as shown in FIG. 4, the second heat dissipation member 304 serving as a heat dissipation path from the EVF 401 is fastened to the top cover 301 on a negative side (side toward the grip 130) of the optical axis in the X-axis direction. This make it possible to arrange the heat dissipation paths for the EVF 401 and the wireless communication module 501 away from each other with respect to the optical axis in the X-axis direction and increase respective heat dissipation effects.

Figure 9:
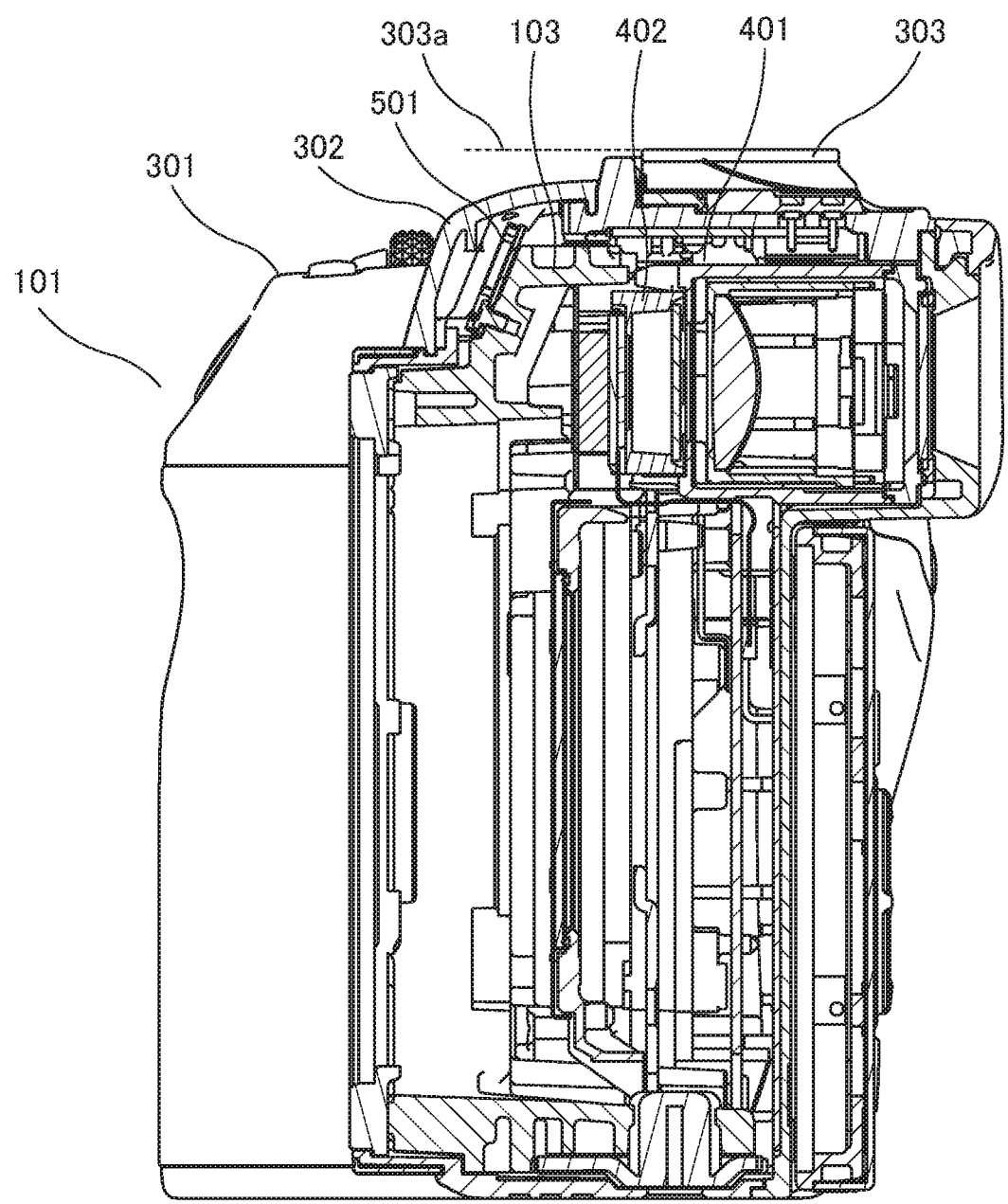
FIG. 9 is a cross-sectional view taken along A-A in FIG. 1A.

FIG. 9 is a cross-sectional view taken along A-A in FIG. 1A. As shown in FIG. 9, the wireless communication module 501 is arranged such that it overlapps a front surface (left side as viewed in FIG. 9) of the EVF 401, and is arranged at a location closer to the main body structure 103 than a top surface 303*a* of the accessory shoe 303. This makes it possible to arrange the wireless communication module 501 without increasing the size of the camera body 101.

Although in the present embodiment, the wireless communication module 501 is arranged on the front side of the EVF 401, the wireless communication module 501 may be arranged in a manner overlapping an upper surface of the EVF 401 insofar as it is arranged at a location which is closer to the main body structure 103 than the top surface 303*a* of the accessory shoe 303, and does not overlap the accessory shoe 303, as viewed from above.

Further, the wireless communication module 501 is arranged on an opposite side of the main body structure 103 from the EVF 401, so that the wireless communication module 501 is at a location closer to the antenna cover 302, which is the non-conductive member, than the main body structure 103, which is the conductive member, and hence it is possible to ensure the wireless performance.

As described above, in the present embodiment, it is possible to arrange the antenna 502 of the wireless communication module 501 in the digital camera equipped with the EVF 401 in a space saving manner while preventing the casing from becoming hot, and suppressing electric noise.

Next, a description will be given of a digital camera as an image pickup apparatus according to a second embodiment of the present invention with reference to FIGS. 10 to 12B. In the present embodiment, the same components as those of the first embodiment are denoted by the same reference numerals in the drawings, and the description is given mainly of different points. Although in the above-described first embodiment, the top cover 301 is formed of resin which is lower in thermal conductivity and electric conductivity than metal by way of example, in the present embodiment, a top cover 701 is made of metal.

Figure 10:
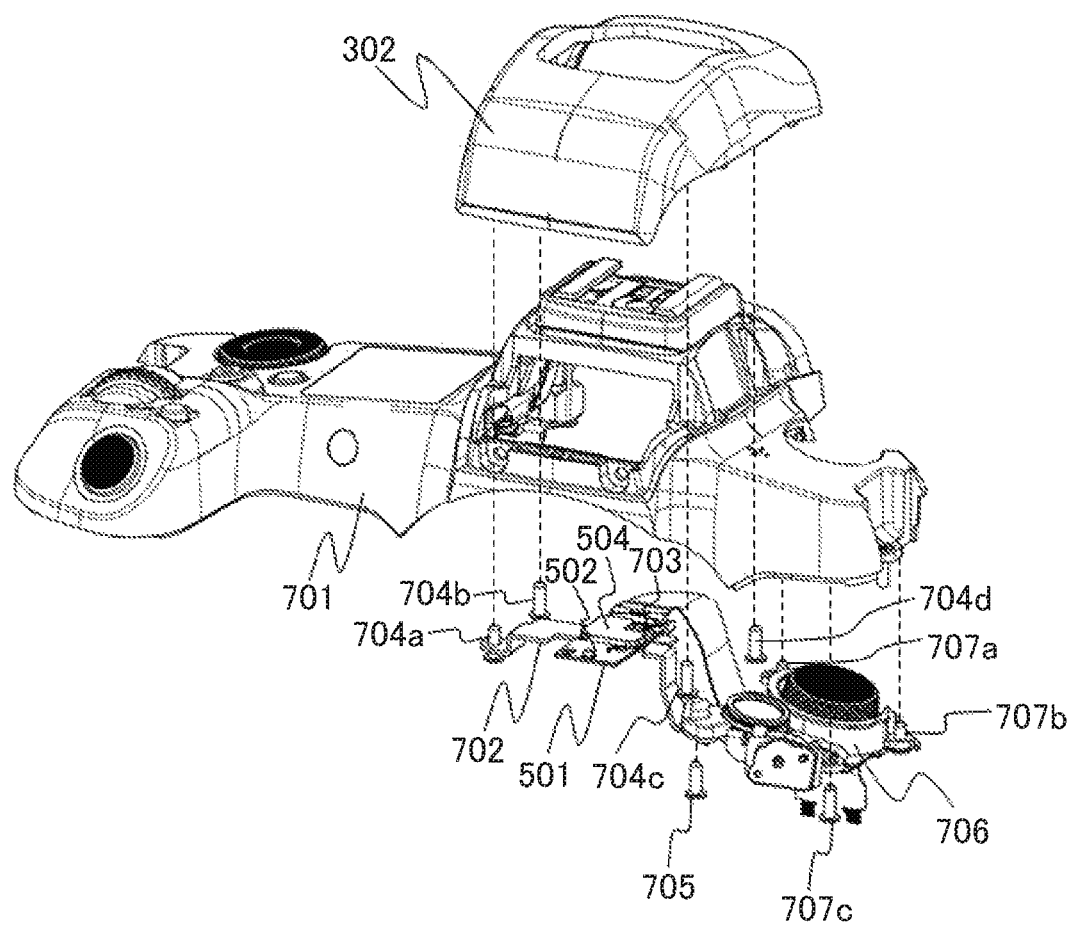
FIG. 10 is an exploded perspective view useful in explaining a relationship between a top cover made of metal and a wireless communication module of a digital camera as an image pickup apparatus according to a second embodiment of the present invention.

FIG. 10 is an exploded perspective view useful in explaining a relationship between the top cover 701 made of metal and the wireless communication module 501. The top cover 701 is formed of a metal material having high thermal conductivity, such as a magnesium alloy. The top cover 701 corresponds to an example of the first casing of the present invention. The wireless communication module 501 is fastened to a metal member 702 formed by e.g. a metal plate having high thermal conductivity with a screw 703. The metal member 702 is directly connected to part of the top cover 701 on a side (left side as viewed in FIG. 10) of the optical axis toward the photographing button 120, which part has a larger volume than part referred to hereinafter, with a screw 704*a*, and preferentially achieves ground connection of the wireless communication module 501 to the top cover 701. This makes it possible to make secure ground connection of the wireless communication module 501.

As described above, in the present embodiment, heat of the wireless communication module 501 is diffused to the part of the top cover 701, which has the larger volume. To this end, the metal member 702 is fastened to a molded member 706 with a screw 705, and is fastened via the molded member 706 to the part of the top cover 701, which is referred to hereinabove and has a smaller volume, on an opposite side of the optical axis from the photographing button 120, with screws 707*a* to 707*c*. The antenna cover 302 formed of non-conductive resin is fastened to the top cover 701 with the screw 704*a* and screws 704*b* to 704*d*.

Figure 11:
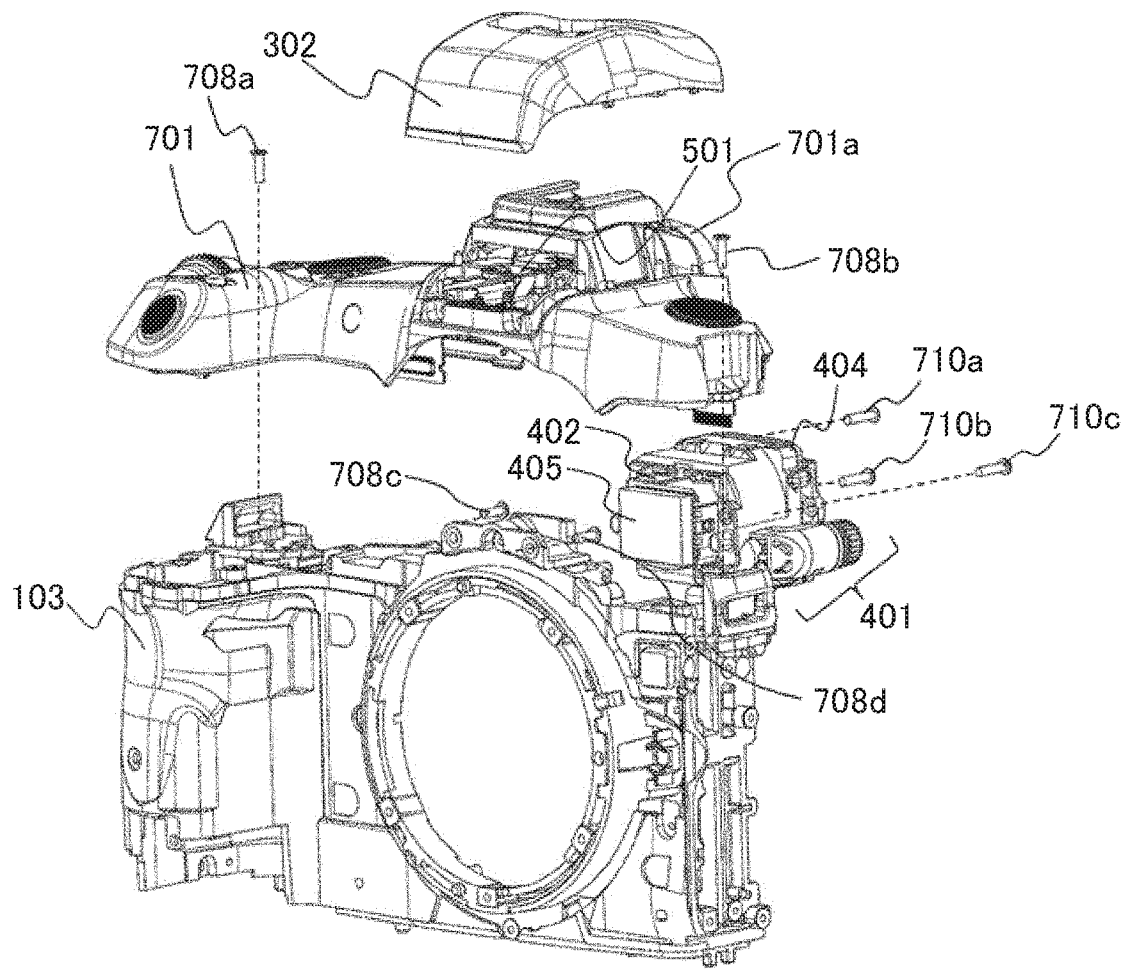
FIG. 11 is an exploded perspective view useful in explaining connection between a main body structure, an electronic viewfinder, and the top cover.

FIG. 11 is an exploded perspective view useful in explaining connection between the main body structure 103, the EVF 401, and the top cover 701. As shown in FIG. 11, the top cover 701 is fastened to the main body structure 103 with screws 708*a* to 708*d*, for electric conduction to achieve ground connection. The EVF 401 is thermally connected to the main body structure 103 via the elastic body 405 having high thermal conductivity, and heat generated in the EVF 401 is dissipated into the main body structure 103.

In the present embodiment, the first heat dissipation member 406 of the first embodiment is not required, the main body structure (main body chassis) 103 corresponds to an example of the second casing of the present invention, and heat can be preferentially dissipated and diffused into the main body structure 103. The EVF 401 has the EVF holder 404 thereof, which does not generate heat, fastened to a rear surface 701*a* of the top cover 701 with screws 710*a* to 710*c*.

Figure 12A:
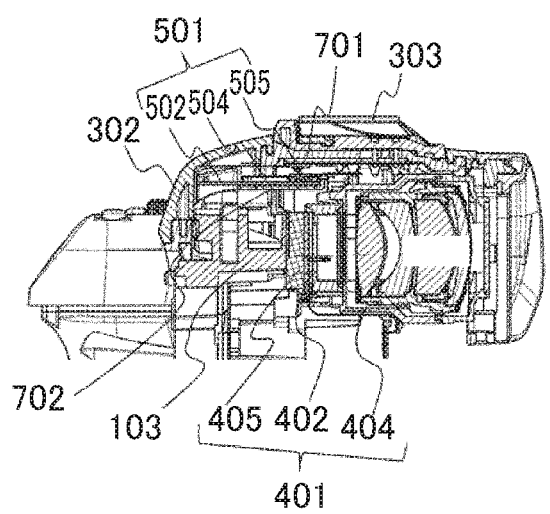
FIG. 12A is a cross-sectional view of essential components surrounding the wireless communication module.
Figure 12B:
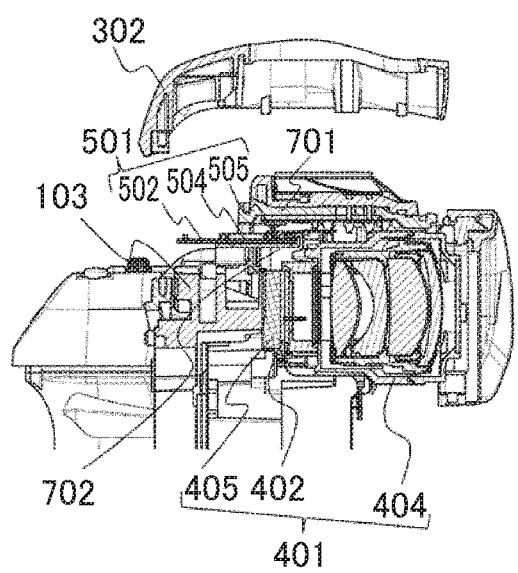
FIG. 12B is a cross-sectional view showing a state in which an antenna cover made of non-conductive resin is lifted off from the essential components shown in FIG. 12A.

FIG. 12A is a cross-sectional view of essential components surrounding the wireless communication module 501. FIG. 12B is a cross-sectional view showing a state in which the antenna cover 302 made of non-conductive resin is lifted off from the essential components shown in FIG. 12A.

Referring to FIGS. 12A and 12B, the connector (connection terminal) 505, which does not generate heat, of the wireless communication module 501 is disposed on the upper surface of the EVF 401 in an overlapping manner, and the wireless IC (communication controller) 504, which generates heat, of the wireless communication module 501 is disposed on an inner side of the top cover 701, opposite from the accessory shoe 303. Further, as described above, heat of the EVF 401 is dissipated into the main body structure 103 via the elastic body 405, and the metal member 702 to which the wireless communication module 501 is fixed is disposed between the wireless communication module 501 and the EVF 401.

With this arrangement, it is possible to arrange the wireless communication module 501 close to the EVF 401 without increasing the size of the camera body 101 while preferentially dissipating heat from the wireless communication module 501 to the top cover 701. Further, as shown in FIG. 12B, the antenna 502 of the wireless communication module 501 is disposed outside the top cover 701 and the main body structure 103 which are the metal members, in a protruding manner, and hence it is possible to ensure the antenna performance. Other components and advantageous effects are the same as those provided by the first embodiment.

Note that the present invention is not limited to the above-described embodiments, but the materials, the shapes, the sizes, the forms, the numbers, and the disposed positions of the components described in the embodiments by way of example can be changed without departing from the spirit and scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-084280 filed Apr. 25, 2018, which is hereby incorporated by reference herein in its entirety.

What is claimed is:

1. An image pickup apparatus comprising:
    an image sensor;
    an electronic viewfinder having a display section that displays an image of an object, captured by the image sensor;
    a wireless communicator including an antenna capable of performing wireless communication, a communication controller, and a connection terminal;
    a first casing to which the wireless communicator is thermally connected; and
    a second casing which is different from the first casing and to which the electronic viewfinder is thermally connected,
    wherein the first casing is a cover made of metal, which covers an upper surface of the image pickup apparatus, the second casing is a body chassis made of metal, and the first casing and the second casing are connected for electric conduction, and
    wherein the communication controller and the connection terminal are disposed on an inner side of the first casing, the connection terminal is disposed in a manner overlapping a top surface of the electronic viewfinder, and the antenna is disposed in a manner protruding from the first casing.

2. The image pickup apparatus according to claim 1, wherein the first casing to which the wireless communicator is thermally connected is larger both in surface area and volume than the second casing to which the electronic viewfinder is thermally connected.

3. The image pickup apparatus according to claim 1, further comprising a circuit board that performs calculation processing,
    wherein the wireless communicator is electrically connected to the circuit board via the first casing.

4. The image pickup apparatus according to claim 1, wherein the second casing is a cover that covers an upper surface of the image pickup apparatus.

5. The image pickup apparatus according to claim 1, further comprising a metal member which is disposed between the wireless communicator and the electronic viewfinder and to which the wireless communicator is fixed.

6. The image pickup apparatus according to claim 5, wherein the metal member and the first casing are the same member.

* * * * *